(12) United States Patent
Yamazaki

(10) Patent No.: US 7,216,496 B2
(45) Date of Patent: May 15, 2007

(54) HEATING MEDIUM CIRCULATING DEVICE AND THERMAL, TREATMENT EQUIPMENT USING THE DEVICE

(75) Inventor: Koichi Yamazaki, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 234 days.

(21) Appl. No.: 10/491,748

(22) PCT Filed: Oct. 4, 2002

(86) PCT No.: PCT/JP02/10383

§ 371 (c)(1),
(2), (4) Date: Apr. 5, 2004

(87) PCT Pub. No.: WO03/033973

PCT Pub. Date: Apr. 24, 2003

(65) Prior Publication Data

US 2004/0244384 A1    Dec. 9, 2004

(30) Foreign Application Priority Data

Oct. 10, 2001  (JP) .............................. 2001-313219

(51) Int. Cl.
*F25B 21/02* (2006.01)
*F25B 17/02* (2006.01)
*F25D 23/12* (2006.01)

(52) U.S. Cl. .............................. 62/185; 62/3.2; 62/3.3; 62/3.7; 62/201; 62/259.2

(58) Field of Classification Search .................. 62/3.2, 62/3.3, 3.7, 183, 185, 201, 259.2; 361/701, 361/702
See application file for complete search history.

(56) References Cited

U.S. PATENT DOCUMENTS 5,128,517 A * 7/1992 Bailey et al. ................ 219/506

(Continued)

FOREIGN PATENT DOCUMENTS

JP          2-40930          10/1990

(Continued)

OTHER PUBLICATIONS

International Preliminary Examination Report (PCT/IPEA/409) (translated) issued for PCT/JP02/10383.

(Continued)

*Primary Examiner*—Cheryl Tyler
*Assistant Examiner*—B. Clayton McCraw
(74) *Attorney, Agent, or Firm*—Smith, Gambrell & Russell, LLP

(57) ABSTRACT

There is provided a heating medium circulating apparatus which is small and which does not require a very large installation space. In a heating medium circulating apparatus wherein a temperature controlling object being an object to be temperature-controlled, a main heat exchanger 88 for carrying out main heat exchange with a heating medium, and a circulating pump 84 are provided in a heating medium circulating system 78, a sub-heat exchanger 96 using a thermoelectric element 100 is provided in the heating medium circulating system downstream of the main heat exchanger to control the temperature of the heating medium. Thus, the apparatus itself is small, and the installation space is not very large.

21 Claims, 6 Drawing Sheets

U.S. PATENT DOCUMENTS

| | | | |
|---|---|---|---|
| 5,525,160 A | 6/1996 | Tanaka et al. | 118/728 |
| 5,711,155 A * | 1/1998 | DeVilbiss et al. | 62/3.7 |
| 5,956,965 A | 9/1999 | Watanabe et al. | 62/389 |
| 5,966,940 A * | 10/1999 | Gower et al. | 62/3.3 |
| 6,091,060 A * | 7/2000 | Getchel et al. | 219/483 |
| 6,125,635 A * | 10/2000 | Nomura et al. | 62/3.2 |
| 6,233,955 B1 * | 5/2001 | Egara | 62/196.4 |
| 6,338,474 B1 | 1/2002 | Semba | 261/128 |

FOREIGN PATENT DOCUMENTS

| | | |
|---|---|---|
| JP | 05-051294 | 3/1993 |
| JP | 5-132987 | 5/1993 |
| JP | 6-326078 | 11/1994 |
| JP | 8-14692 | 1/1996 |
| JP | 9-170863 | 6/1997 |
| JP | 09-219369 | 8/1997 |
| JP | 10-132436 | 5/1998 |
| JP | 10-151631 | 6/1998 |
| JP | 10-339517 | 12/1998 |
| JP | 2000-299280 | 10/2000 |
| JP | 2001-34344 | 2/2001 |
| JP | 2001-41495 | 2/2001 |

OTHER PUBLICATIONS

Notification of Transmittal of Copies of Translation of the International Preliminary Examination Report (PCT/IB/338).

* cited by examiner

HEATING MEDIUM CIRCULATING DEVICE AND THERMAL, TREATMENT EQUIPMENT USING THE DEVICE

TECHNICAL FIELD

The present invention relates generally to a heating medium circulating apparatus and a single wafer processing heat treatment system for carrying out various heat treatments, such as deposition, with respect to semiconductor wafers.

BACKGROUND ART

In general, various heat treatments, such as deposition, pattern etching, oxidation diffusion and refining, are repeatedly carried out with respect to a semiconductor wafer to produce a desired semiconductor device. With the increase of wafer size, there is a tendency to often use a so-called single wafer processing heat treatment system which can more easily obtain the inplane uniformity of treatment than that in a batch heat treatment system. The single wafer processing heat treatment system is disclosed in Japanese Patent Laid-Open Nos. 5-51294 and 9-219369.

For example, the heat treatment system of this type has a mounting table for supporting thereon a semiconductor wafer, a heating lamp serving as a wafer heating means, a resistance heater and so forth, in an evacuated processing vessel. When a heat treatment is carried out, while a predetermined required gas is supplied from a shower head portion provided on the ceiling portion of the vessel or the like, the pressure in the processing vessel is maintained at a predetermined process pressure, and a wafer is heated and maintained at a predetermined process temperature to carry out deposition and so forth.

In this case, if the shower head portion and the wall face of the processing vessel are excessively heated, e.g. when deposition is carried out, an undesired film and a reaction by-product adhere to the wall face. Therefore, the shower head portion and the wall face of the processing vessel are cooled by a cooling mechanism to prevent the temperature thereof from excessively rising. If a heating lamp is used as a heating means, the temperature of a partition wall of a lamp chamber for housing therein the heating lamp excessively rises, so that a cooling mechanism is provided for cooling this.

By the way, a chiller for producing and circulating a fluid at a constant temperature is generally used as the cooling mechanism. The chiller has a very large heat exchange system for cooling a heating medium to a predetermined temperature and for circulating the medium to a structure to be cooled.

The chiller has the advantage of easily controlling the temperature of the medium. However, since the chiller is very large as described above, there is a problem in that equipment costs do not only rise, but the installation space (foot print) is also too large.

DISCLOSURE OF THE INVENTION

The present invention has been made to effectively solve the above described problem. It is an object of the present invention to provide a heating medium circulating apparatus which is small and which is installed in a relatively small installation space, and a heat treatment system using the same.

According to a first aspect of the present invention, there is provided a heating medium circulating apparatus for causing a heat medium to flow through a heating medium circulating system to control temperature, wherein a temperature controlling object being an object to be temperature-controlled is provided in the heating medium circulating system, the apparatus comprising: a main heat exchanger, provided in the heating medium circulating system, for carrying out main heat exchange with a heating medium; a circulating pump provided in the heating medium circulating system; and a sub-heat exchanger, provided in the heating medium circulating system downstream of the main heat exchanger, for controlling a temperature of the heating medium, the sub-heat exchanger using a thermoelectric element.

Thus, the main heat exchanger and the sub-heat exchanger are used for carrying out main heat exchange by cooling the heating medium by the main heat exchanger, and thereafter, for carrying out fine temperature controlling heat exchange by the sub-heat exchanger using the thermoelectric element. Therefore, the temperature of the delivered heating medium can not only be appropriately controlled, but the apparatus itself and its installation space can also be greatly decreased.

The heating medium circulating apparatus may further comprise a storage tank for temporarily storing therein the heating medium. Thus, the temperature-controlled heating medium is temporarily stored in the storage tank, so that the temperature controlling object can be stably temperature-controlled.

The heating medium circulating apparatus may further comprise: a temperature detecting sensor provided in the heating medium circulating system downstream of the sub-heat exchanger; and a temperature control part for controlling an output to the thermoelectric element on the basis of an output of the temperature detecting sensor part.

The sub-heat exchanger may comprise: a heat exchange passage which is provided in a lid portion of the storage tank and which has a heating medium inlet at one end and a heating medium outlet at the other end; the thermoelectric element, one face of which is bonded to the lid portion; and a heat wasting unit bonded to the other face of the thermoelectric element.

The heating medium circulating apparatus may further comprise a plurality of heat exchange fins contacting the heating medium flowing through the heat exchange passage, the heat exchange fins being provided in the heat exchange passage. Thus, the heat exchange efficiency in the sub-heat exchanger can be improved by the function of the heat exchange fins.

The sub-heat exchanger may comprise: a plurality of heat pipes which is provided in a lid portion of the storage tank and the bottom end of which is immersed in the heating medium stored in the storage tank; the thermoelectric element, one face of which is bonded to the lid portion; and a heat wasting unit bonded to the other face of the thermoelectric element.

A heat wasting heating medium for discharging heat to be wasted may be caused to flow through the main heat exchanger and the sub-heat exchanger in that order.

The heating medium circulating apparatus may further comprise a by-pass passage for causing the heating medium to bypass the main heat exchanger, and the heating medium may bypass the main heat exchanger to flow through the by-pass passage if necessary, the thermoelectric element being operated so as to heat the heating medium. Thus, if necessary, the heating medium can bypass the main exchanger to be fed directly into the sub-heat exchanger to be heated and temperature-raised therein, to pass through the temperature controlling object in the heated state to heat it.

The thermoelectric element may be a Peltier element.

The temperature controlling object may be at least one of a processing vessel, which is used for a heat treatment system for carrying out a predetermined treatment with respect to a processing object, a shower head portion for supplying a required gas, and a partition wall of a lamp chamber for housing therein a heating lamp.

According to a second aspect of the present invention, a heat treatment system comprises: a processing vessel capable of being evaluated; a mounting table for mounting thereon a processing object; gas supply means for supplying a required gas into the processing vessel; heating means for heating the processing object; and any one of the above described heating medium circulating apparatuses.

BEST MODE FOR CARRYING OUT THE INVENTION

Referring to the accompanying drawings, a preferred embodiment of a heating medium circulating apparatus and a heat treatment system using the same according to the present invention will be described below.

Figure 1:
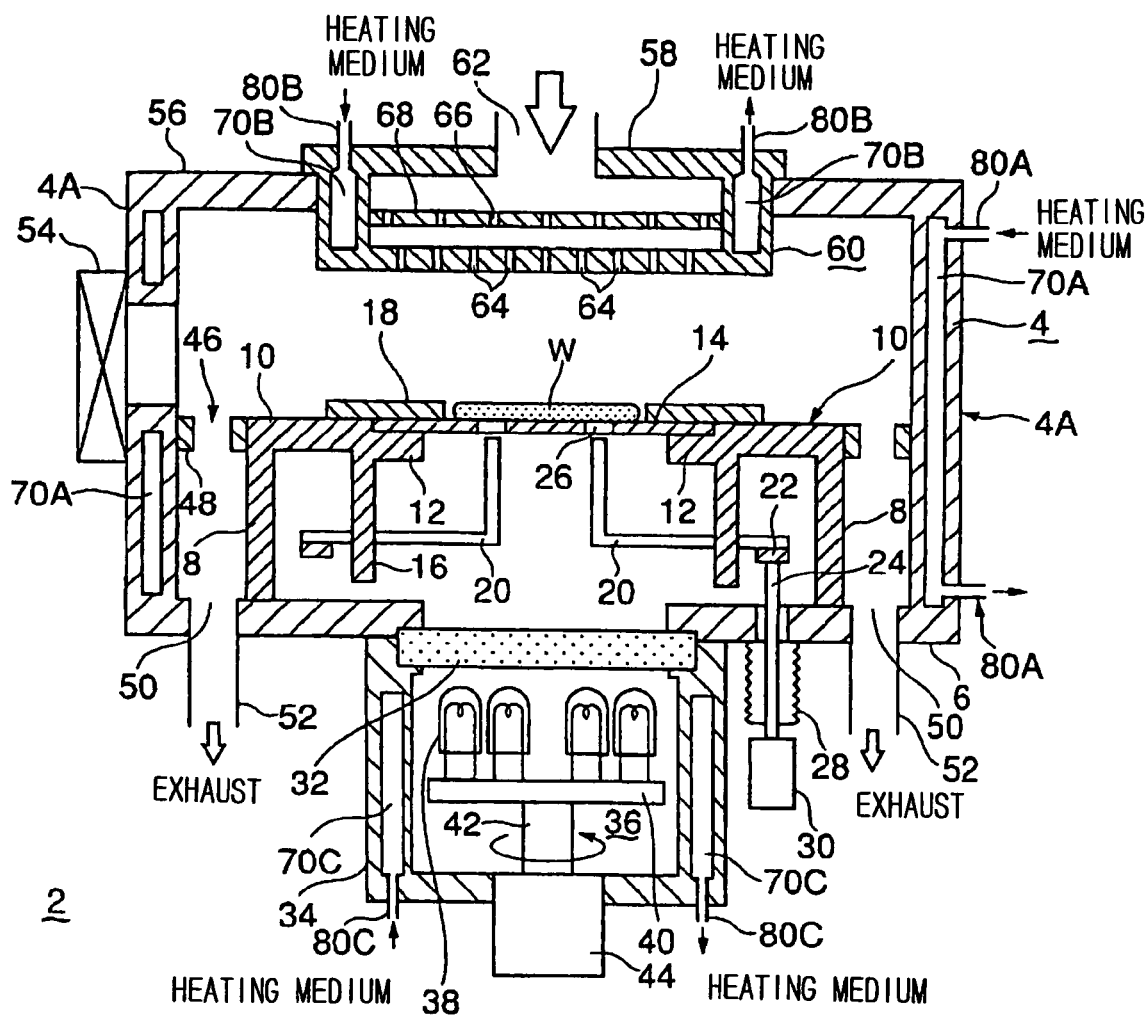
FIG. 1 is a sectional view showing a preferred embodiment of a heat treatment system using a heating medium circulating apparatus according to the present invention.
Figure 2:
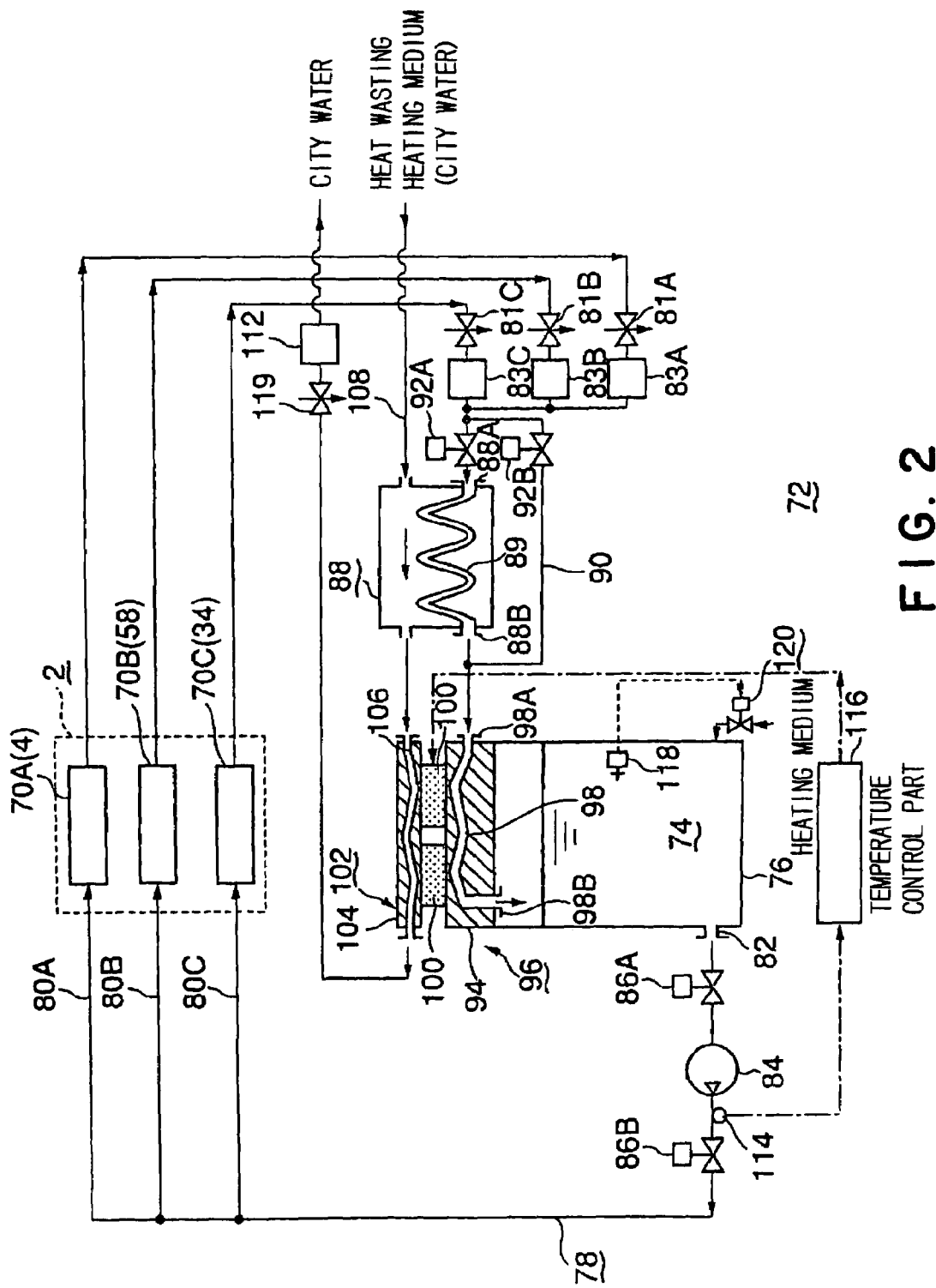
FIG. 2 is a block diagram showing a heating medium circulating apparatus according to the present invention.
Figure 3:
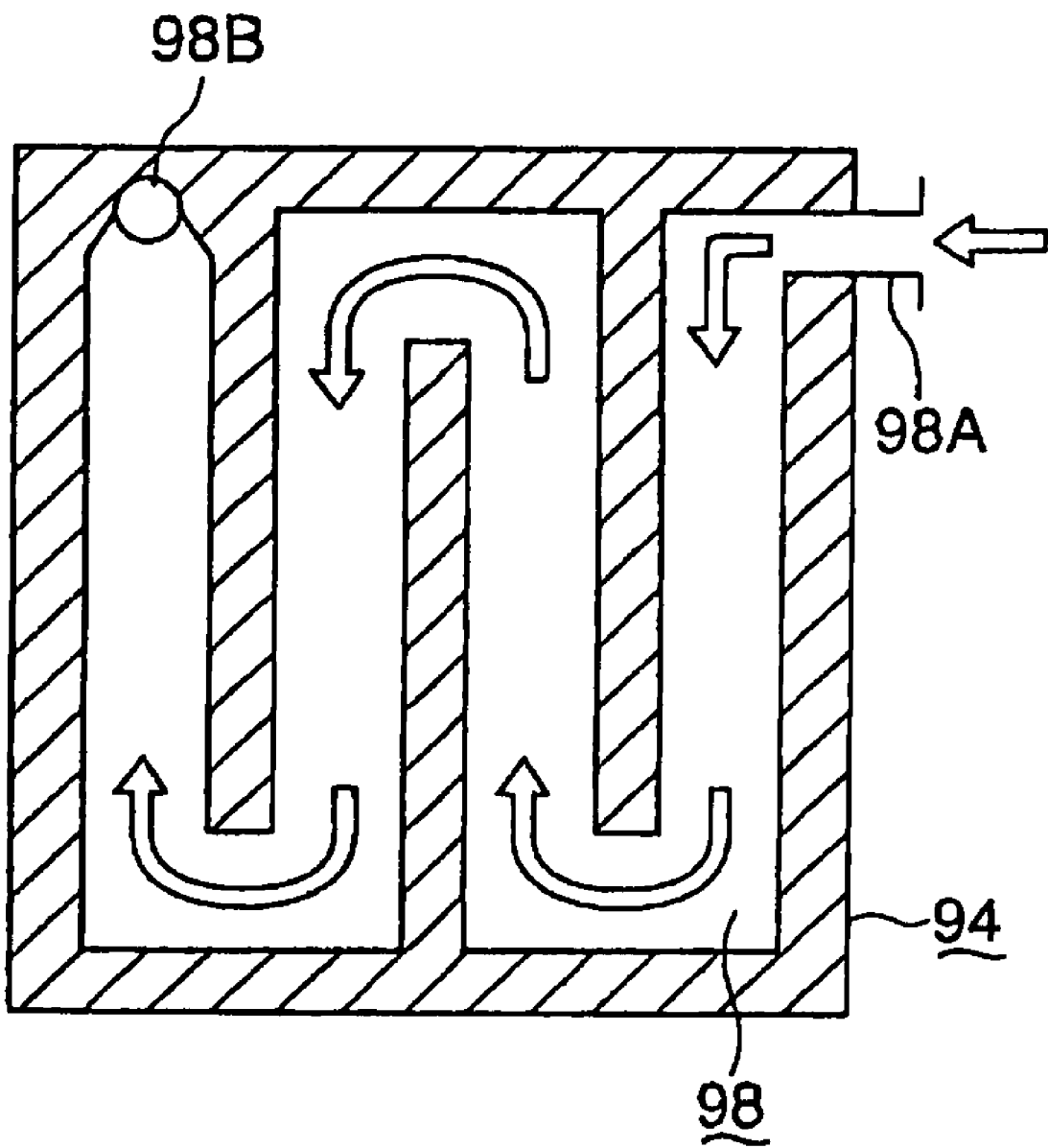
FIG. 3 is a cross-sectional view showing a lid portion of a storage tank.
Figure 4:
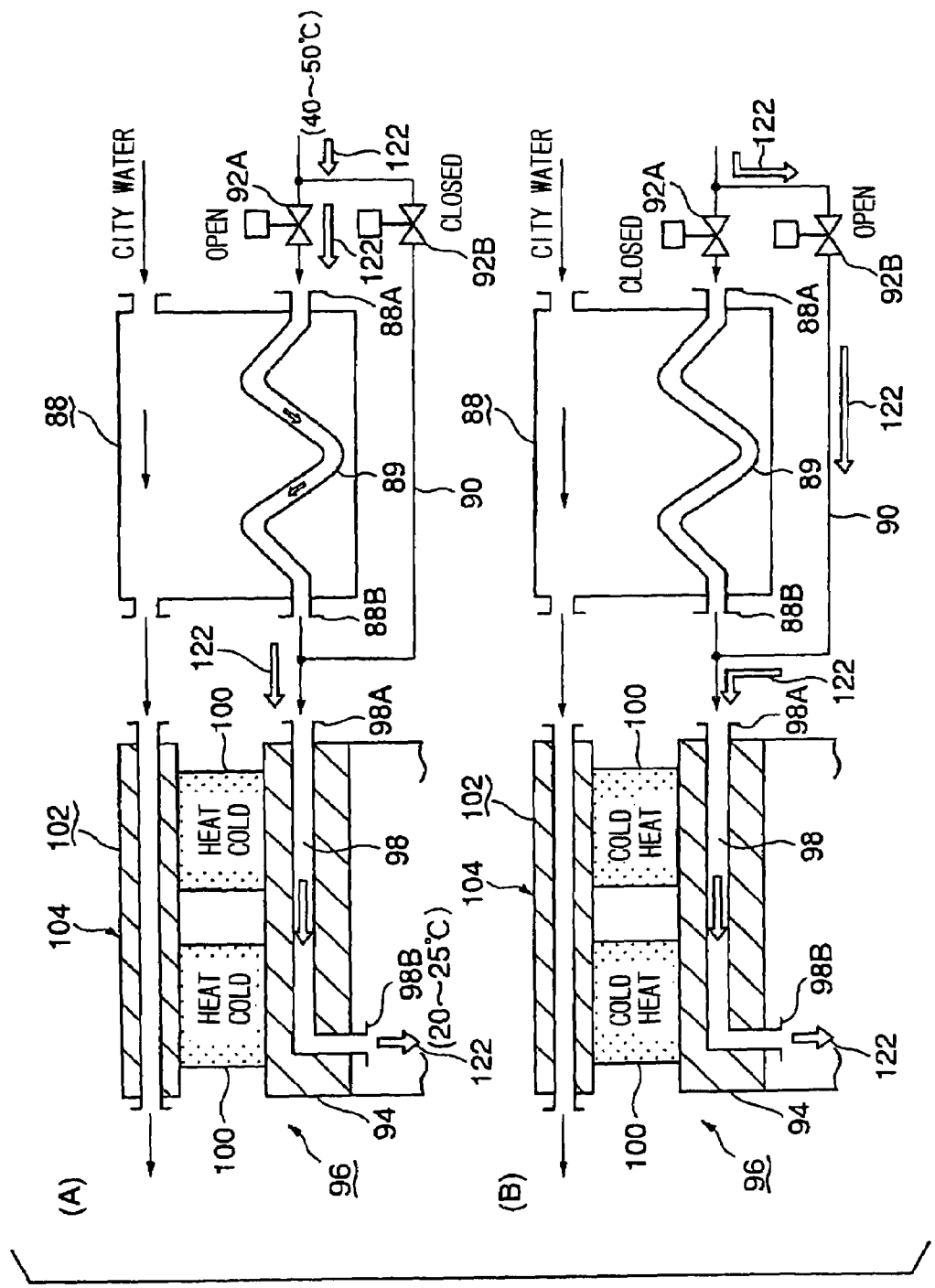
FIG. 4 is an illustration showing the flow of a heating medium.

FIG. 1 is a sectional view showing a preferred embodiment of a heat treatment system using a heating medium circulating apparatus according to the present invention, and FIG. 2 is a block diagram showing a heating medium circulating apparatus according to the present invention. FIG. 3 is a cross-sectional view showing a lid portion of a storage tank, and FIG. 4 is an illustration showing the flow of a heating medium.

In this preferred embodiment, a single wafer processing heat treatment system used for carrying out deposition will be described as an example. This heat treatment system 2 has a processing vessel 4 of, e.g. aluminum, which defines therein a cylindrical or box-shaped space. In the processing vessel 4, a cylindrical mounting table supporting base 8 rising from the bottom portion 6 of the processing vessel 4 is provided. The supporting base 8 may be supported on the side walls of the vessel. The mounting table supporting base 8 is formed of a corrosion-resistant material, such as aluminum. On the cylindrical mounting table supporting base 8, a ring-shaped gas flow stabilizing flange portion 10 is provided. A ring-shaped supporting shelf portion 12 slightly inwardly protruding from the flange portion 10 is formed.

On the supporting shelf portion 12, the peripheral edge portion of a disk-shaped mounting table 14 is mounted. The mounting table 14 is formed of, e.g. SiC, having a thickness of about 3 to 4 mm. The diameter of the mounting table 14 varies in accordance with the size of a semiconductor wafer W which is to be mounted thereon to be processed. For example, if an 8-inch wafer is to be processed, the diameter of the mounting table 14 is about 24 cm.

From the inner peripheral portion of the gas flow stabilizing flange portion 10, a cylindrical reflector 16 of, e.g. aluminum, extends downwards. The inner face of the reflector 16 serves as a reflecting surface. The bottom end of the reflector 16 is slightly spaced from the bottom portion 6 of the processing vessel 4 to float. From the inner peripheral portion of the gas flow stabilizing flange portion 10 of the mounting table supporting base 8 toward the top of the peripheral edge portion of the mounting table 14, a circular ring-shaped shield ring 18 is provided.

Below the mounting table 14, a plurality of, e.g. three, L-shaped lifter pins 20 (only two are shown in FIG. 1) are provided so as to rise upwards. If a ring-shaped connecting member 22 connected to the base portion of each of the lifter pins 20 is moved by a push-up rod 24 in vertical directions, the lifter pins 20 can pass through lifter pin holes 26, which are formed in the mounting table 14, to lift the wafer W. The lifter pins 20 are formed of a heat ray permeable material, such as quartz. A part of the reflector 16 has a long hole (not shown) which allows the lifter pins 20 to move in vertical directions.

The bottom end of the push-up rod 24 is connected to an actuator 30 via a retractable bellow 28 for holding an air-tight state in the processing vessel 4.

On the bottom portion 6 of the vessel directly below the mounting table 14, a transmission window 32 of a heat ray permeable material, such as quartz, is air-tightly provided. Below this, a box-shaped partition wall 34 surrounding the transmission window 32 is formed to define a lamp chamber 36 therein. In the lamp chamber 36, a plurality of heating lamps 38 serving as a heating means are mounted on a rotating table 40 also serving as a reflecting mirror. The rotating table 40 is rotated by a rotating motor 44, which is provided on the bottom of the lamp chamber 36, via a rotating shaft 42. Therefore, the bottom face of the mounting table 14 is designed to be irradiated with heat rays, which are emitted from the heating lamps 38 to pass through the transmission window 32, to be heated.

Between the outer periphery of the gas flow stabilizing flange portion 10 and the side wall 4A of the processing vessel 4, a ring-shaped straightening vane 48 of, e.g. aluminum, having a large number of straightening holes 46 are provided to be connected to the side wall 4A of the processing vessel 4 to supported thereon. In the bottom portion 6 below the straightening vane 48, an outlet 50 is provided. The outlet 50 is connected to an exhaust passage 52 which is connected to a vacuum pump (not shown), so that the processing vessel 4 can be evacuated to a predetermined degree of vacuum. On the side wall 4A of the processing vessel 4, a gate valve 54 is provided so as to be open and closed when the wafer is carried in and out.

On the other hand, the ceiling portion 56 of the processing vessel 4 facing the mounting table 14 is provided with a shower head portion 58 serving as a gas supply means for feeding a process gas or the like into the processing vessel 4. Specifically, the shower head portion 58 has a circular box-shaped head body 60 of, e.g. aluminum. The ceiling portion is provided with a gas inlet 62 for feeding a required gas, the flow rate of which is controlled.

In the whole gas injecting surface being the bottom face of the head body 60, a large number of gas nozzles 64 for emitting a gas, which is supplied into the head body 60, are arranged, so that the gas is emitted to the surface of the wafer.

In the head body 60, a diffusion plate 68 having a large number of gas diffusion holes are arranged so as to more uniformly supply the gas to the surface of the wafer.

When a usual heat treatment is carried out, the processing vessel 4, the shower head portion 58, and the partition wall 34 defining the lamp chamber 36 are objects, the temperature of which is to be controlled, i.e. temperature controlling objects, in order to prevent them from excessively temperature-rising. Therefore, the side wall 4A of the processing vessel 4, the side wall of the head body 60 of the shower head portion 48, and the partition wall 34 defining the lamp chamber 36 are formed with heating medium jackets 70A, 70B and 70C for allowing the flow of a heating medium, respectively.

As shown in FIG. 2, a heating medium, the temperature of which is controlled by a heating medium circulating apparatus 72, is supplied to each of the heating medium jackets 70A, 70B and 70C. For example, water (including cooling water or heating hot water) is used as the heating medium.

Specifically, the heating medium circulating apparatus 72 has a heating medium circulating system 78 in which a storage tank 76 for temporarily storing therein a heating medium 74 is provided. The heating medium circulating system 78 branches off into three branching passages 80A, 80B and 80C which are extend in parallel. In the branching passages 80A, 80B and 80C, the heating medium jackets 70A, 70B and 70C are provided, respectively. In the branching passages 80A, 80B and 80C, shut-off valves 81A, 81B and 81C and flow meters 83A, 83B and 83C are provided, respectively.

In the downstream-side heating medium circulating system 78 connected to a medium outlet 82 of the storage tank 76, a circulating pump 84 for circulating the heating medium 74 is provided. On both sides thereof, shut-off valves 86A and 86B are provided, respectively.

In the upstream-side heating medium circulating system 78 of the storage tank 76, a main heat exchanger 88 for mainly exchanging heat with the heating medium flowing through the system is provided. A by-pass passage 90 branches from the system in parallel to the main heat exchanger 88 so as to allow the heating medium to by-pass the main heat exchanger 88 if necessary. In the main heat exchanger 88, an inside pipe 89, through which the heating medium passes, is provided. In the heating medium circulating system 78 connected to the inlet side 88A and by-pass passage 90, switching shut-off valves 92A and 92B are provided, respectively, so that the heating medium selectively flows through the main heat exchanger 88 and by-pass passage 90.

The lid portion 94 of the storage tank 76 is formed of a good thermal conductive material, such as aluminum or copper. The lid portion 94 is provided with a sub-heat exchanger 96. Specifically, for example, as shown in FIG. 3, a meandering heat exchanging passage 98 is formed in the lid portion 94. A heating medium inlet 98A being one end on the upstream side thereof is connected to an outlet side 88B of the inside pipe 89 of the main heat exchanger 88 via the heating medium circulating system 78, and the other end on the downstream side thereof is formed as a heating medium outlet 98B which is open to the interior of the storage tank 76, so that the heating medium after the sub-heat exchange drops into the storage tank 76 to be temporarily stored therein.

On the top face of the lid 94, plate-shaped thermoelectric elements 100 of, e.g. Peltier elements, are provided so as to be bonded to the top face of the lid 94. Thus, for example, the heating medium flowing through the heat exchange passage 98 of the lid portion 94 can be temperature-controlled while being cooled. Although two plate-shaped thermoelectric elements 100 are shown in the figure, e.g. about twenty thermoelectric elements 100 are arranged in plane in accordance with the size of the storage tank 76 and so forth.

On the other ends (top faces) of the thermoelectric elements 100, a heat wasting unit 102 for carrying and wasting, e.g. heat, which is produced on the other faces (bottom faces) of the thermoelectric elements 100, is mounted. The heat wasting unit 102 forms a heat exchange passage 106 for allowing wasting heating medium to flow through a block body 104 of a good heat conductive material, such as aluminum or copper. In the vessel of the main heat exchanger 88 and the heat exchange passage 106 of the heat wasting unit 102, a heat wasting passage 108 is formed so as to allow the wasting heating medium to sequentially flow through them in that order. Also in this passage 108, a shut-off valve 119 and a flow meter 112 are provided. For example, ordinary temperature city water (service water) is used as the heat wasting heating medium.

On the other hand, in the heating medium circulating system 78 downstream of the circulating pump 84, there are provided with a temperature detecting sensor, e.g., a thermocouple 114, for detecting the temperature of the heating medium flowing through them. The output of the thermocouple 114 is inputted to a temperature control part 116 comprising, e.g. a microcomputer and so forth. The temperature control part 116 can control the temperature of the heating medium by controlling the output to the thermoelectric element 100 on the basis of the output of the thermocouple 114.

In the storage tank 76, a level switch 118 for detecting the liquid level of the heating medium stored therein is provided. If the heating medium is insufficient, a shortage of heating medium can be supplied by a heating medium supply system 120.

With this construction, the operation of this preferred embodiment will be described below.

First, for example, when a tungsten film or a tungsten silicide film is to be deposited on the surface of a wafer, the gate valve 54 provided on the side wall 4A of the processing vessel 4 is open to carry a wafer W in the processing vessel 4 by means of a transfer arm (not shown), to deliver the wafer W to the side of the lifter pins 20 by pushing up the lifter pins 20. Then, the lifter pins 20 are moved downward by depressing the push-up rod 24, so that the wafer W is mounted on the mounting table 14.

Then, a predetermined amount of each of various required gases, such as deposition gases, is supplied to the shower head portion 58 from a process gas source (not shown). This is substantially uniformly supplied into the processing vessel 4 from the gas nozzles 64 in the bottom face of the head body 60. Simultaneously, the internal atmosphere is attracted and exhausted from the outlet 50 to maintain the interior of the processing vessel 4 at a predetermined degree of vacuum, and the heating lamps 38 in the lamp chamber 36 are driven while being rotated, so that heat energy is emitted.

The reverse surface of the mounting table 14 is irradiated with emitted heat rays passing through the transmission window to be heated. Since the mounting table 14 has a very small thickness of about several millimeters as described above, it is rapidly heated. Therefore, the wafer W mounted thereon can be rapidly heated to a predetermined temperature. The supplied gas causes a predetermined chemical reaction to deposit and form, e.g., a tungsten film, on the surface of the wafer.

When the deposition is carried out, there is the possibility that the partition wall 34 of the lamp chamber 36, the side wall 4A of the processing vessel 4, the shower head portion 58 and so forth are exposed to a high temperature state by the heat rays from the heating lamp 38. However, in this preferred embodiment, the cooling heating medium having a substantially constant temperature flows through the heating medium jackets 70A, 70B and 70C provided therein, to cool them to prevent them from being excessively rising.

That is, also as shown in FIG. 2, the heating medium stored in the storage tank 76 serves as a cooling medium which is maintained at a temperature of, e.g. about 20 to 25° C. therein. Thus, the heating medium passes through the heating medium circulating system 78 to pass through each of the branching passages 80A to 80C to enter each of the heating medium jackets 70A to 70C to cool the side wall 4A of the processing vessel 4, the shower head portion 58, and the partition wall 34 of the lamp chamber 36. The heating medium passing through the heating medium jackets 70A to 70C is at a high temperature of, e.g. 40 to 50° C., by the above described heat exchange. This heating medium joins to sequentially flow through the main heat exchanger 88 and the sub-heat exchanger 96 provided in the lid portion 94 of the storage tank 76. At this time, the heating medium is heat-exchanged with ordinary temperature city water being the heat wasting heating medium, to be cooled to, e.g. about 20 to 25° C., and thereafter, circulated and used again.

At this time, the heating medium flowing through the main heat exchanger 88 and sub-heat exchanger 96 is shown in FIG. 4(A) wherein the flow of the heating medium is shown by an outline arrow 122. That is, city water having a temperature of about 20° C. sequentially flows through the main heat exchanger 88 and the heat exchange passage 106 in the heat wasting unit 102 via the heat wasting passage 108 in that order. On the other hand, the switching shut-off valve 92B provided in the by-pass passage 90 is herein closed, and the switching shut-off valve 92A provided in the heating medium circulating system 78 is open. Therefore, cooling water being the heating medium sequentially flows through the inside pipe 89 in the main heat exchanger and the heat exchange passage 98 of the lid portion. At this time, the thermoelectric element 100 is operated so that cold is produced on the side of the bottom face and heat is produced on the top face. Therefore, the heating medium circulated from the side of the heat treatment system 2 is mainly heat-exchanged by the main heat exchanger 88 provided in a front stage, so that the temperature thereof is greatly decreased to a temperature of, e.g. about 27 to 29° C. Then, the heating medium is further cooled by a slight temperature, e.g. several degrees, by the sub-heat exchanger 96 to about 20 to 25° C.

The thermocouple 114 is provided in the heating medium circulating system 78 downstream of the circulating pump 84 for always detecting the temperature of the heating medium passing therethrough. This is inputted to the temperature control part 116. The temperature control part 116 controls power, which is to be inputted to the thermoelectric element 100, so that the temperature detected by the thermocouple 114 is maintained at a preset value. Thus, the temperature of the heating medium circulating within the heating medium circulating system 78 is substantially maintained at a preset value.

In addition, city water flowing through the heat wasting passage 108 first flows through the main heat exchanger 88 so as to increase the difference in temperature between heating media, and then, flows through the heat wasting unit 102 of the sub-heat exchanger 96 so as to decrease the difference in temperature between heating media, so that the temperature of the heating medium 74 in the storage tank 76 can be appropriately controlled.

In addition, since the whole structure is relatively simple as shown in the figure, facility costs can be lower than those of conventional large chillers, and the installation space can be far lower than that of conventional large chillers.

On the other hand, when the processing vessel 4 is open during the maintenance of the heat treatment system 2 or the like, if clean air flows into the processing vessel 4 to contact the cooled side wall 4A of the processing vessel 4 and the cooled shower head portion 58 to condense moisture in the clean air, troubles are caused. In this case, contrary to the above described case, the side wall 4A of the processing vessel 4, the shower head portion 58 and so forth are heated to prevent dew condensation during maintenance. In addition, when the processing vessel 4 is open, there are some cases where reaction by-products adhering to the inner wall of the processing vessel 4 easily absorbs moisture in air to react. This is prevented by heating the side wall of the processing vessel 4 and the shower head portion 58 as described above.

The flow of the heating medium at this time is shown in FIG. 4(B). That is, although city water flowing through the heat wasting passage 108 flows similar to the case shown in FIG. 4(A), the heating medium is caused to flow through the by-pass passage 90 by closing the switching shut-off valve 92A on the inlet side 88A of the inside pipe 89 and by opening the switching shut-off valve 92B of the by-pass passage 90, in order to prevent the heating medium from flowing through the main heat exchanger 88. Moreover, the apparatus is operated so that the current-carrying direction to the thermoelectric element 100 in the sub-heat exchanger 96 is opposite to the above described case in order to heat the heating medium. Thus, heat is produced on the bottom face, and cold is produced on the top face.

Thus, the heating medium is heated to a predetermined temperature, e.g. about 50° C., to be circulated.

In fact, the apparatus of the present invention was prepared to be evaluated. As a result, the occupying space was smaller than that of the conventional chiller by about 25.5 to 35%. In addition, the power consumption of the conventional chiller was 20 KVA, whereas the power consumption of the apparatus of the present invention (using twenty Peltier elements) was 2 KW which was greatly decreased.

While the storage tank 76 for temporarily storing therein the heating medium has been provided, the heating medium may continuously flows into the heating medium circulating system 78 without the need of the storage tank 76 and without being temporarily stored therein.

A modified example of the present invention will be described below.

Figure 5:
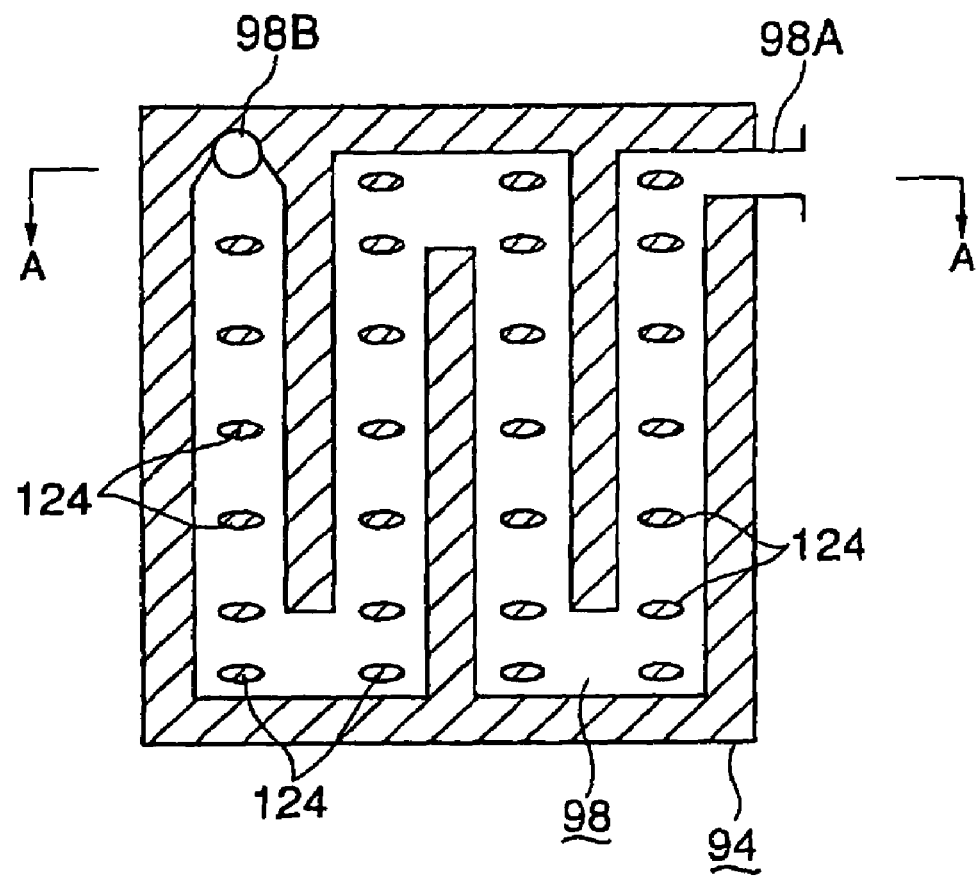
FIG. 5 is a cross-sectional view showing a modified example of a sub-heat exchanger according to the present invention.
Figure 6:
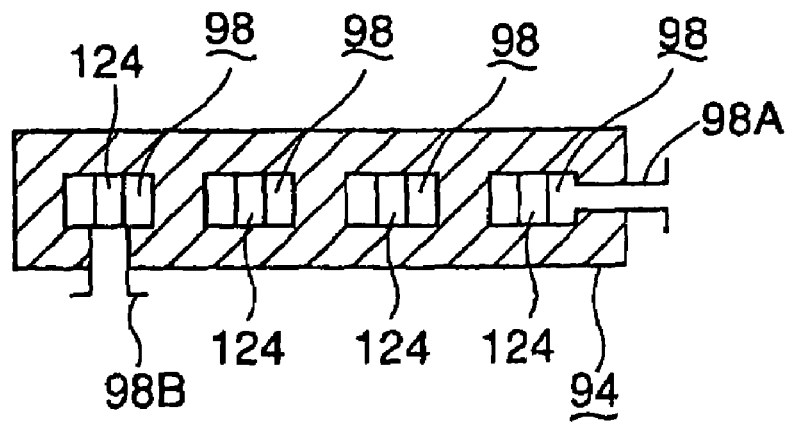
FIG. 6 is a sectional view taken along line A—A of FIG. 5.

FIG. 5 is a cross-sectional view showing a modified example of a sub-heat exchanger according to the present invention, and FIG. 6 is a sectional view taken along line A—A of FIG. 5. In this example, a plurality of heat exchanging fins 124 are provided in the heat exchange passage 98 of the sub-heat exchanger 96 to directly contact the heating medium. The heat exchanging fins 124 are formed of a good heat conductive material, such as aluminum or copper, and have a substantially elliptic cross section to rise in the heat exchange passage 98. The large number of heat exchange fins 124 are arranged at regular intervals in the direction of the flow of the heating medium.

Thus, the heat exchange efficiency with the heating medium can be improved by the heat exchange fins 124. In this case, the heat exchange fins may be thinner and inclined by a predetermined angle, e.g. about 45 degrees, with respect to the direction of the flow of the heating medium, so as to maintain a high heat exchange efficiency while suppressing the fluid resistance to the heating medium.

The second preferred embodiment of the present invention will be described below.

Figure 7:
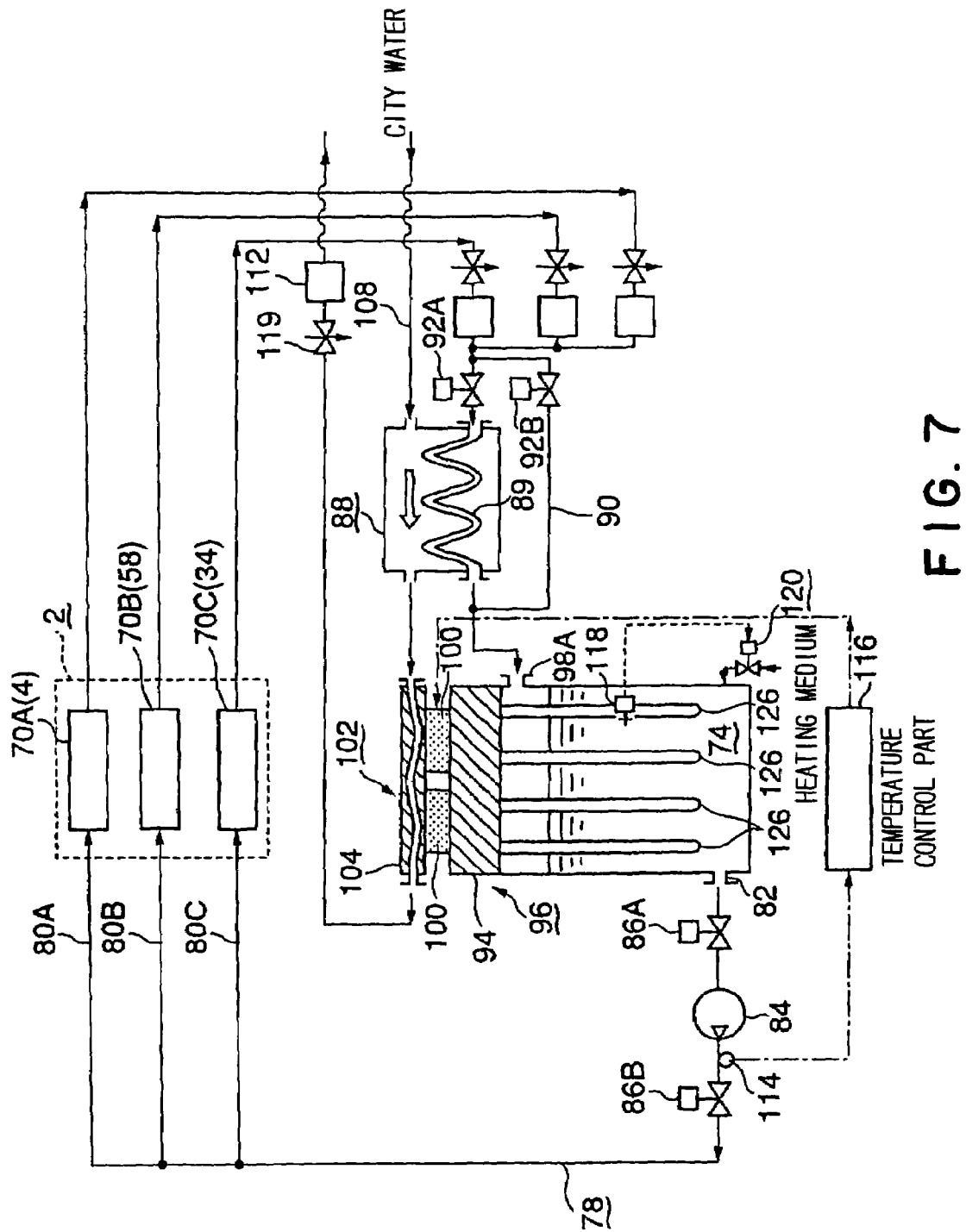
FIG. 7 is a block diagram showing a second preferred embodiment of a heat circulating apparatus according to the present invention.

FIG. 7 is a block diagram showing the second preferred embodiment of a heat circulating apparatus according to the present invention. The same reference numbers are given to the same portions as those shown in FIG. 2, and the descriptions thereof are omitted.

In this second preferred embodiment, the lid portion 94 is not provided with the heat exchange passage 98 (see FIG. 2). In place of this, there are provided a plurality of heat pipes 126, the top end of which is supported on the lid portion 94 and the bottom end of which is immersed in the heating medium 74 in the storage tank 76. Thus, the heat of the heating medium 74 is pumped up by the heat pipe 126 to the top to be wasted by the heat wasting unit 102.

In this case, the heating medium inlet 98A to the storage tank 76 is not provided in the lid portion 94, and is provided with the upper side wall of the storage tank 76, so that the heating medium circulated to be returned to leave the main heat exchanger 88 is fed into the storage tank 76 directly from the heating medium inlet 98.

Also in the case of the second preferred embodiment, the same effects as those in the preceding preferred embodiment can be obtained.

While the processing vessel 4, the shower head portion 58 and the partition wall 34 of the lamp chamber 36 have been temperature controlling objects in the above described preferred embodiment, they are only examples, but the present invention may be, of course, applied to all members which are required to be cooled.

The heat treatment should not be limited to deposition. The present invention may be applied to all heat treatments, such as etching, oxidation diffusion and refining. The objects to be processed should not be limited to semiconductor wafers. The present invention may be applied to glass substrates, LCD substrates and so forth.

As described above, the heating medium circulating apparatus and heat treatment system using the same according to the present invention have excellent effects as follows.

According to the present invention, the main heat exchanger and the sub-heat exchanger are used for carrying out main heat exchange by cooling the heating medium by the main heat exchanger, and thereafter, for carrying out fine temperature controlling heat exchange by the sub-heat exchanger using the thermoelectric element. Therefore, the temperature of the delivered heating medium can not only be appropriately controlled, but the apparatus itself and its installation space can also be greatly decreased.

In addition, the heat exchange efficiency in the sub-heat exchanger can be improved by the function of the heat exchange fins.

Moreover, if necessary, the heating medium can bypass the main exchanger to be fed directly into the sub-heat exchanger to be heated and temperature-raised therein, to pass through the temperature controlling objects in the heated state to heat them.

The invention claimed is:

1. A heating medium circulating apparatus for causing a heat medium to flow through a heating medium circulating system to control temperature, wherein a temperature controlling object being an object to be temperature-controlled is provided in said heating medium circulating system, said apparatus comprising:
   a main heat exchanger, provided in said heating medium circulating system, for carrying out main heat exchange with a heating medium;
   a circulating pump provided in said heating medium circulating system;
   a sub-heat exchanger, provided in said heating medium circulating system downstream of said main heat exchanger, for controlling a temperature of said heating medium, said sub-heat exchanger using a thermoelectric cooling element; and
   a storage tank for temporarily storing therein said heating medium;
   wherein said sub-heat exchanger comprises:
      a heat exchange passage which is provided in said storage tank and which has a heating medium inlet at one end and a heating medium outlet at the other end;
      said thermoelectric cooling element, one face of which is bonded to said storage tank; and
      a heat wasting unit bonded to the other face of said thermoelectric cooling element.

2. A heating medium circulating apparatus as set forth in claim 1, which further comprises:
   a temperature detecting sensor provided in said heating medium circulating system downstream of said sub-heat exchanger; and
   a temperature control part for controlling an output to said thermoelectric cooling element on the basis of an output of said temperature detecting sensor part.

3. A heating medium circulating apparatus as set forth in claim 1, which further comprises a plurality of heat exchange fins contacting said heating medium flowing through said heat exchange passage, said heat exchange fins being provided in said heat exchange passage.

4. A heating medium circulating apparatus as set forth in claim 1, wherein a heat wasting heating medium for discharging heat to be wasted is caused to flow through said main heat exchanger and said sub-heat exchanger in that order.

5. A heating medium circulating apparatus as set forth in claim 1, wherein said thermoelectric cooling element is a Peltier element.

6. A heating medium circulating apparatus as set forth in claim 1, wherein said temperature controlling object is at least one of a processing vessel, which is used for a heat treatment system for carrying out a predetermined treatment with respect to a processing object, a shower head portion for supplying a required gas, and a partition wall of a lamp chamber for housing therein a heating lamp.

7. A heating medium circulating apparatus as set forth in claim 1, wherein a level switch for detecting a liquid level of the heating medium stored in the storage tank is provided in the storage tank.

8. A heating medium circulating apparatus as set forth in claim 1, wherein the heat wasting unit forms a heat exchange passage for receiving flow of a heat wasting heating medium.

9. A heating medium circulating apparatus as set forth in claim 8, wherein the main heat exchanger and the heat exchange passage formed in the heat wasting unit form a heat wasting passage so as to allow the heat wasting heating medium to sequentially flow through the main heat exchanger and the heat exchange passage in the heat wasting unit, in that order.

10. A heating medium circulating apparatus for causing a heat medium to flow through a heating medium circulating system to control temperature, wherein a temperature controlling object being an object to be temperature-controlled is provided in said heating medium circulating system, said apparatus comprising:
- a main heat exchanger, provided in said heating medium circulating system, for carrying out main heat exchange with a heating medium;
- a circulating pump provided in said heating medium circulating system;
- a storage tank for temporarily storing therein said heating medium;
- a sub-heat exchanger, provided in said heating medium circulating system downstream of said main heat exchanger, for controlling a temperature of said heating medium, said sub-heat exchanger using a thermoelectric cooling element, the thermoelectric cooling element having one face thereof bonded to said storage tank;
- a heat wasting unit bonded to the other face of said thermoelectric cooling element, and
- a by-pass passage for causing said heating medium to bypass said main heat exchanger, and wherein said heating medium bypasses said main heat exchanger to flow through said by-pass passage if necessary, said thermoelectric cooling element being operated so as to heat said heating medium.

11. A heating medium circulating apparatus as set forth in claim 10, wherein a heat wasting heating medium for discharging heat to be wasted is caused to flow through said main heat exchanger and said sub-heat exchanger in that order.

12. A heating medium circulating apparatus as set forth in claim 10, wherein said thermoelectric cooling element is a Peltier element.

13. A heating medium circulating apparatus as set forth in claim 10, wherein said temperature controlling object is at least one of a processing vessel, which is used for a heat treatment system for carrying out a predetermined treatment with respect to a processing object, a shower head portion for supplying a required gas, and a partition wall of a lamp chamber for housing therein a heating lamp.

14. A heating medium circulating apparatus as set forth in claim 10, wherein the heat wasting unit forms a heat exchange passage for receiving flow of a heat wasting heating medium.

15. A heating medium circulating apparatus as set forth in claim 14, wherein the main heat exchanger and the heat exchange passage formed in the heat wasting unit form a heat wasting passage so as to allow the heat wasting heating medium to sequentially flow through the main heat exchanger and the heat exchange passage in the heat wasting unit, in that order.

16. A heat treatment system comprising:
- a processing vessel capable of being evaluated;
- a mounting table for mounting thereon a processing object;
- gas supply means for supplying a required gas into said processing vessel;
- heating means for heating said processing object; and
- a heating medium circulating apparatus for causing a heat medium to flow through a heating medium circulating apparatus to control temperature,
wherein a temperature controlling object being an object to be temperature-controlled is provided in said heating medium circulating system, said apparatus comprising:
- a main heat exchanger, provided in said heating medium circulating system, for carrying out main heat exchange with a heating medium;
- a circulating pump provided in said heating medium circulating system;
- a sub-heat exchanger, provided in said heating medium circulating system downstream of said main heat exchanger, for controlling a temperature of said heating medium, said sub-heat exchanger using a thermoelectric cooling element; and
- a storage tank for temporarily storing therein said heating medium;
wherein said sub-heat exchanger comprises:
- a heat exchange passage which is provided in said storage tank and which has a heating medium inlet at one end and a heating medium outlet at the other end;
- said thermoelectric cooling element, one face of which is bonded to said storage tank; and
- a heat wasting unit bonded to the other face of said thermoelectric cooling element.

17. A heating medium circulating apparatus as set forth in claim 16, wherein the heat wasting unit forms a heat exchange passage for receiving flow of a heat wasting heating medium.

18. A heating medium circulating apparatus as set forth in claim 17, wherein the main heat exchanger and the heat exchange passage formed in the heat wasting unit form a heat wasting passage so as to allow the heat wasting heating medium to sequentially flow through the main heat exchanger and the heat exchange passage in the heat wasting unit, in that order.

19. A heat treatment system comprising:
- a processing vessel capable of being evaluated;
- a mounting table for mounting thereon a processing object;
- gas supply means for supplying a required gas into said processing vessel;
- heating means for heating said processing object; and
- a heating medium circulating apparatus for causing a heat medium to flow through a heating medium circulating system to control temperature,
wherein a temperature controlling object being an object to be temperature-controlled is provided in said heating medium circulating system, said apparatus comprising:
- a main heat exchanger, provided in said heating medium circulating system, for carrying out main heat exchange with a heating medium;
- a circulating pump provided in said heating medium circulating system;
- a storage tank for temporarily storing therein said heating medium;
- a sub-heat exchanger, provided in said heating medium circulating system downstream of said main heat exchanger, for controlling a temperature of said heating medium, said sub-heat exchanger using a thermoelectric cooling element, the thermoelectric cooling element having one face thereof bonded to said storage tank;

a heat wasting unit bonded to the other face of the thermoelectric cooling element; and a by-pass passage for causing said heating medium to bypass said main heat exchanger, and wherein said heating medium bypasses said main heat exchanger to flow through said by-pass passage if necessary, said thermoelectric cooling element being operated so as to heat said heating medium.

20. A heating medium circulating apparatus as set forth in claim 19, wherein the heat wasting unit forms a heat exchange passage for receiving flow of a heat wasting heating medium.

21. A heating medium circulating apparatus as set forth in claim 20, wherein the main heat exchanger and the heat exchange passage formed in the heat wasting unit form a heat wasting passage so as to allow the heat wasting heating medium to sequentially flow through the main heat exchanger and the heat exchange passage in the heat wasting unit, in that order.

* * * * *